United States Patent
Sengupta et al.

(10) Patent No.: US 10,784,198 B2
(45) Date of Patent: Sep. 22, 2020

(54) POWER RAIL FOR STANDARD CELL BLOCK

(71) Applicant: Samsung Electronics Co., Ltd., Suwon-si, Gyeonggi-do (KR)

(72) Inventors: Rwik Sengupta, Austin, TX (US); Andrew Paul Hoover, Austin, TX (US); Matthew Berzins, Cedar Park, TX (US); Sam Tower, Austin, TX (US); Mark S. Rodder, Dallas, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/681,243

(22) Filed: Aug. 18, 2017

(65) Prior Publication Data

US 2018/0269152 A1    Sep. 20, 2018

Related U.S. Application Data

(60) Provisional application No. 62/474,028, filed on Mar. 20, 2017.

(51) Int. Cl.
*H01L 23/528* (2006.01)
*H01L 27/02* (2006.01)
(Continued)

(52) U.S. Cl.
CPC .... *H01L 23/5286* (2013.01); *H01L 21/31111* (2013.01); *H01L 21/3212* (2013.01); *H01L 21/32133* (2013.01); *H01L 21/7684* (2013.01); *H01L 21/76805* (2013.01); *H01L 21/76843* (2013.01); *H01L 21/76877* (2013.01); *H01L 23/5226* (2013.01); *H01L 23/5283* (2013.01); (Continued)

(58) Field of Classification Search
CPC ........... H01L 23/49827; H01L 23/5226; H01L 23/538; H01L 23/5286; H01L 21/76805; H01L 23/5283; H01L 21/76843; H01L 21/76877
See application file for complete search history.

(56) References Cited

U.S. PATENT DOCUMENTS 4,866,507 A    9/1989   Jacobs et al.
6,838,713 B1   1/2005   Gheewala et al.
(Continued)

OTHER PUBLICATIONS

Pan et al., "A Proposal for a Novel Hybrid Interconnect Technology for the End of Roadmap," IEEE Electron Device Letters, 35(2): 250-252, Feb. 2014.

*Primary Examiner* — Thanh Y. Tran
(74) *Attorney, Agent, or Firm* — Lewis Roca Rothgerber Christie LLP

(57) ABSTRACT

A semiconductor integrated circuit including a substrate, a series of metal layers, and a series of insulating layers. The metal layers and the insulating layers are alternately arranged in a stack on the substrate. The semiconductor integrated circuit also includes at least two standard cells in the substrate and at least one power rail crossing over boundaries of the at least two standard cells. The power rail includes a vertical section of conductive material extending continuously through at least two vertical levels of the stack. The two vertical levels of the stack include one metal layer and one insulating layer. The insulating layer is above the metal layer.

20 Claims, 4 Drawing Sheets

(51) Int. Cl.
    *H01L 23/522* (2006.01)
    *H01L 21/3213* (2006.01)
    *H01L 21/311* (2006.01)
    *H01L 21/768* (2006.01)
    *H01L 21/321* (2006.01)
    *H01L 23/532* (2006.01)
    *H01L 27/118* (2006.01)

(52) U.S. Cl.
    CPC .... *H01L 27/0207* (2013.01); *H01L 23/53209* (2013.01); *H01L 23/53228* (2013.01); *H01L 23/53242* (2013.01); *H01L 2027/11881* (2013.01)

(56) References Cited

U.S. PATENT DOCUMENTS

| | | | |
|---|---|---|---|
| 7,087,845 B2* | 8/2006 | Tohkairin | H05K 1/0207 174/252 |
| 7,760,578 B2 | 7/2010 | Vinke et al. | |
| 8,431,968 B2 | 4/2013 | Lu et al. | |
| 8,507,957 B2 | 8/2013 | Hou et al. | |
| 8,513,978 B2 | 8/2013 | Sherlekar | |
| 8,694,945 B2 | 4/2014 | Wang et al. | |
| 9,026,977 B2 | 5/2015 | Tarabbia et al. | |
| 9,570,395 B1 | 2/2017 | Sengupta et al. | |
| 9,666,520 B2* | 5/2017 | Yu | H01L 23/36 |
| 9,761,655 B1* | 9/2017 | Ando | H01L 28/75 |
| 9,806,055 B2* | 10/2017 | Yu | H01L 21/563 |
| 2010/0270670 A1* | 10/2010 | Yeo | H01L 21/76898 257/700 |
| 2011/0133255 A1* | 6/2011 | Merz | G01N 33/48721 257/253 |
| 2013/0220691 A1* | 8/2013 | Suzuki | H05K 3/4602 174/266 |
| 2013/0270675 A1* | 10/2013 | Childs | H01L 23/5226 257/532 |
| 2014/0264924 A1 | 9/2014 | Yu et al. | |
| 2015/0333008 A1 | 11/2015 | Gupta et al. | |
| 2016/0300848 A1* | 10/2016 | Pachamuthu | H01L 21/768 |
| 2016/0329343 A1* | 11/2016 | Pachamuthu | H01L 27/11582 |
| 2016/0358856 A1 | 12/2016 | Kim | |
| 2017/0092680 A1* | 3/2017 | Kwon | H01L 27/11582 |
| 2017/0278852 A1* | 9/2017 | Kawai | G11C 16/3427 |

* cited by examiner

POWER RAIL FOR STANDARD CELL BLOCK

CROSS-REFERENCE TO RELATED APPLICATION

This application claims priority to and the benefit of U.S. Provisional Application No. 62/474,028, filed Mar. 20, 2017, entitled "Super Power Rail to Reduce IR Drop and EM Degradation of Standard Cell Block," the entire content of which is incorporated herein by reference.

FIELD

The present disclosure relates generally to power rail structures for semiconductor integrated circuits.

BACKGROUND

Power rails are low resistance connections for supplying power (e.g., $V_{SS}$, $V_{DD}$) to standard cells in an integrated circuit. In related art power rails, the power rails include first or second levels of metal (or both) that require connection with a contact or via extending between the metal levels. For instance, FIGS. 1A-1B illustrate a semiconductor integrated circuit including a conventional power rail 100. The conventional power rail 100 illustrated in FIGS. 1A-1B includes a lower power supply trace 101 in a lowermost metal layer M0, a metal stub 102 in an intermediate metal layer M1, an upper power supply trace 103 in upper metal layer M2, a contact CA in a substrate 104 connected to the lower power supply trace 101, a lower via V0 in a first insulating layer 105 extending between and interconnecting the lower power supply trace 101 and the metal stub 102, and an upper via V1 in a second insulating layer 106 extending between and interconnecting the metal stub 102 to the upper power supply trace 103. A transistor may be formed in the substrate 104, and the contact CA may connect to a terminal of the transistor, for example a FET source terminal.

Fabrication of related art power rails is becoming increasingly challenging due to the high resistance of the metal lines in advanced technologies. Such high resistance in the metal lines may be caused by a small cross-sectional metal area, edge scattering, and/or the presence of a liner or barrier reducing the effective cross-section area of the metal lines. Due to the increasing resistance of related art power rails, integrated circuit designers must devote significant amounts of precious metal resources to power grids (e.g., increasing die size due to fewer available signal routing tracks) or design higher resistance power grids and thus impact product frequency. Additionally, using multiple, discrete levels of conductors connected by vias is not efficient due to the high-resistance narrow vias and the multiple high-resistance liners at every dual-damascene level. Additionally, the barriers and liners at each dual-damascene level narrow the rail dimensions and increase bulk conductor material loss.

The above information disclosed in this Background section is provided for enhancement of understanding of the background of the invention, and therefore, it may contain information that does not constitute prior art.

SUMMARY

The present disclosure is directed to various embodiments of a semiconductor integrated circuit. In one embodiment, the semiconductor integrated circuit includes a substrate, a series of metal layers, and a series of insulating layers. The metal layers and the insulating layers are alternately arranged in a stack on the substrate. The semiconductor integrated circuit also includes at least two standard cells in the substrate and at least one power rail crossing over boundaries of the at least two standard cells. The power rail includes a vertical section of conductive material extending continuously through at least two vertical levels of the stack. The two vertical levels of the stack include one metal layer and one insulating layer. The one insulating layer is above the one metal layer.

The at least two vertical levels may include at least three vertical levels of the stack. The three vertical levels include two metal layers of the series of metal layers and one insulating layer of the series of insulating layers between the two metal layers. The two metal layers may include metal layer M0 and metal layer M1. The semiconductor integrated circuit may also include an upper power supply trace in metal layer M2 and a via extending between the upper power supply trace and the vertical section of the power rail. The two metal layers may include metal layer M1 and metal layer M2. The semiconductor integrated circuit may include a lower power supply trace in metal layer M0 and a via extending between the vertical section of the power rail and the lower power supply trace. The at least three vertical levels of the stack may include three metal layers and two insulating layers, and the three metal layers may include metal layer M0, metal layer M1, and metal layer M2.

The vertical section of the conductive material of the at least one power rail may not include a via.

The semiconductor integrated circuit may also include a liner extending around the vertical section of the conductive material. The liner does not extend through the vertical section of the conductive material.

The vertical section of the power rail may exhibit a resistance substantially equal to a bulk resistance of the conductive material.

The conductive material of the at least one power rail may include a metal. A filling conductor of the at least one power rail may be a metal including Cu, Co, Ru, or combinations thereof.

The present disclosure is also directed to various methods of forming a power rail for a semiconductor integrated circuit. In one embodiment, the method includes etching a stack of alternating metal layers and insulating layers on a substrate to form a cavity in the stack, and forming the power rail by depositing a conductive material in the cavity. The power rail includes a vertical section of conductive material extending continuously through at least three vertical levels of the stack. The at least three vertical levels include two metal layers and one insulating layer between the two metal layers.

Etching the stack may include a single etch task.

The method may also include forming a liner prior to depositing the conductive material.

The task of forming the power rail may include chemical-mechanical planarization after depositing the conductive material.

Forming the power rail may include a masking task.

Forming the power rail may include a single patterning task or a litho-etch, litho-etch (LELE) sequence, a self-aligned double-patterning (SADP) sequence, or a self-aligned quad-patterning (SAQP) sequence.

The conductive material may include a metal such as Cu, Co, Ru, or combinations thereof.

A method of forming a power rail for a semiconductor integrated circuit according to another embodiment of the present disclosure includes etching a stack of alternating metal layers and insulating layers on a substrate to form a cavity in the stack, and forming the power rail by depositing a conductive material in the cavity. The power rail includes a vertical section of conductive material extending continuously through at least two vertical levels of the stack. The at least two vertical levels include one metal layer and one insulating layer. The etching of the stack includes a single lithography task.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

These and other features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

DETAILED DESCRIPTION

Figure 1A:
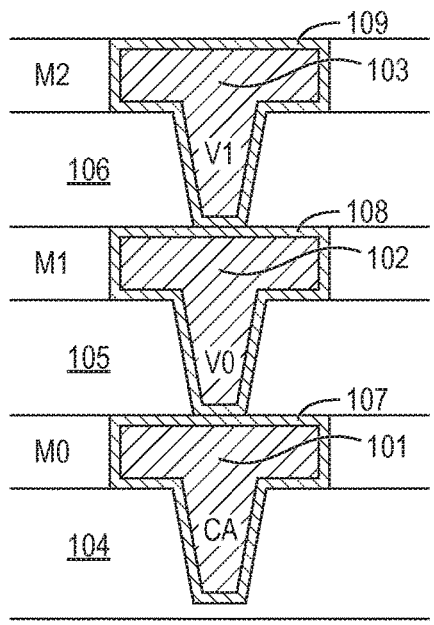
FIGS. 1A-1B are schematic cross-sectional views of a semiconductor integrated circuit including a related art power rail including a series of vias interconnecting discrete metal levels.

The present disclosure is directed to various embodiments of semiconductor integrated circuits including a power rail structure for supplying power (e.g., $V_{SS}$, $V_{DD}$, GND) to standard cell-based logic blocks in the integrated circuit. The power rail structure of the present disclosure is configured to reduce electromigration (EM) degradation and voltage (IR) drop, which is configured to improve product frequency. The power rail structure of the present disclose includes a vertical section of conductive material extending continuously through at least two vertical levels of the stack (e.g., a vertical section of conductive material extending continuously through two metal layers, such as metal layers M0 and M1, and one insulating layer between the two metal layers). Accordingly, the power rail structure according to various embodiments of the present disclosure replaces one or more traces and one or more vias with a single bulk metal filled structure extending continuously through at least two vertical levels of the integrated circuit.

Providing a power rail structure that extends continuously through at least two vertical levels reduces the utilization of dense vias. Reducing the utilization of dense vias reduces total rail resistance and eases the requirement for aggressive patterning during fabrication of the integrated circuit. Additionally, providing a power rail structure that extends continuously through at least two vertical levels reduces the utilization of high resistance liners, which conventionally surround adjacent metal and via layers in conventional power rail structures (e.g., in conventional power rail structures, high resistance liners surround each of the dual-damascene levels, such as the trace in M2 and via V1 or the M1 stub and via V0, which increases the overall resistance of the power rail structure). Furthermore, providing a power rail structure that extends continuously through at least two vertical levels increases the geometric size of the power rail structure compared to conventional power rail structures, and the increased geometric size of the power rail structure may result in the conductive material exhibiting a resistance that is the equal or substantially equal to the bulk resistance properties of the conductive material (e.g., copper). In contrast, the relatively smaller geometries of the conductive material utilized in conventional power rail structures causes the conductive material to exhibit a resistance that is greater than the bulk resistance properties of the conductive material (e.g., approximately twice the bulk resistance of the conductive material).

Semiconductor integrated circuits incorporating the power rail structure of the present disclosure are configured to have increased space available for signal routing because the power rail can be made narrower and vertical straps connecting to the power rail can be made at a relaxed pitch compared to semiconductor integrated circuits incorporating conventional power rails. Additionally, the power rail structure of the present disclosure can enable cell height reduction and/or improved AC FOM and DC FOM (e.g., higher $I_{eff}$).

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2A:
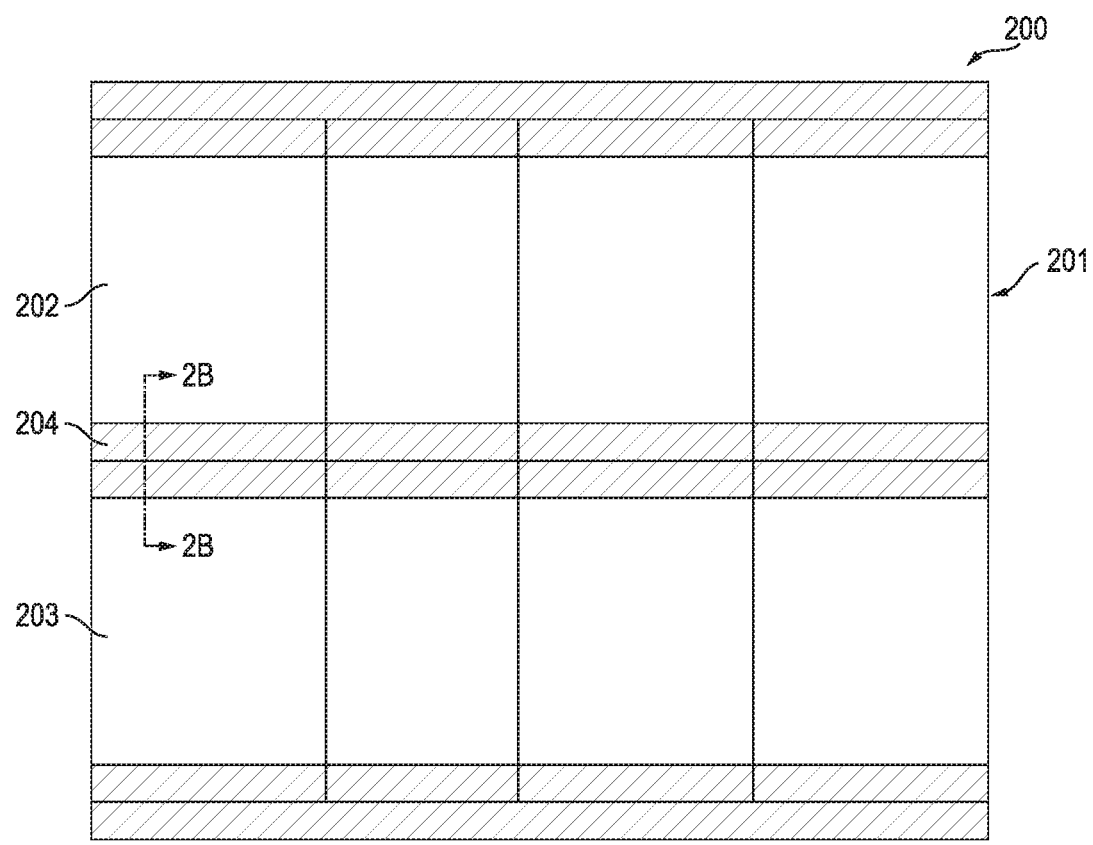
FIGS. 2A-2B are a schematic plan view and a cross-sectional view, respectively, of a semiconductor integrated circuit including a power rail according to one embodiment of the present disclosure.
Figure 2B:
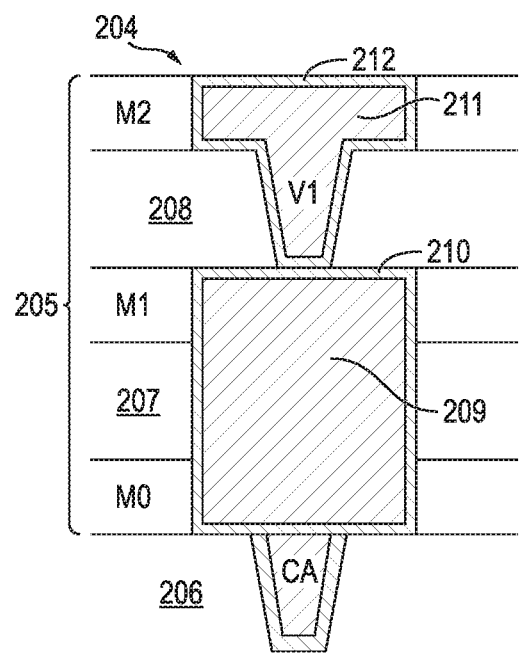

With reference now to FIGS. 2A-2B, a semiconductor integrated circuit 200 according to one embodiment of the present disclosure includes a standard cell block 201 including at least two standard cells 202, 203, and a power rail 204 laterally crossing or extending over boundaries of the two standard cells 202, 203. The power rail 204 is configured to supply power (e.g., $V_{SS}$, $V_{DD}$, GND) to at least the two standard cells 202, 203 in the integrated circuit 200. The standard cells 202, 203 may be any type of cell, such as, for instance, an inverter, a NAND gate, a NOR gate, a counter, a flip flop, or other logic circuits. The standard cells 202, 203 may have different device architectures, such as, for instance, fin or sheet based devices (e.g., finFETs or nanosheet FETs, such as horizontal nanosheet FETs or vertical FETs). Throughout the figures, the standard cells 202, 203 are depicted schematically and the components of the standard cells 202, 203 (e.g., the source/drain electrodes and the gates) are omitted for simplicity.

In the illustrated embodiment, the semiconductor integrated circuit 200 includes a series of metal layers and a series of insulating via layers alternately arranged in a stack 205 on a substrate 206. In the illustrated embodiment, the stack 205 includes a lowermost metal layer M0 on the substrate 206, a lower insulating layer 207 on the lowermost metal layer M0, a second metal layer M1 on the lower insulating layer 207, a second insulating layer 208 on the second metal layer M1, and a third metal layer M2 on the second insulating layer 208.

The power rail 204 includes a continuous vertical section 209 of conductive material extending continuously through at least two vertical layers of the stack 205. In the embodiment illustrated in FIGS. 2A-2B, the continuous vertical section 209 of the power rail 204 extends continuously through the lowermost metal layer M0, the lower insulating layer 207, and the second metal layer M1 (i.e., the continuous vertical section 209 of the power rail 204 extends continuously through two metal layers and one insulating via layer). Additionally, in the illustrated embodiment, the semiconductor integrated circuit 200 includes a liner 210 extending around the continuous vertical section 209 of the conductive material of the power rail 204. The liner 210 does not extend through (e.g., bisect) the continuous vertical section 209 of the power rail 204.

Figure 1B:
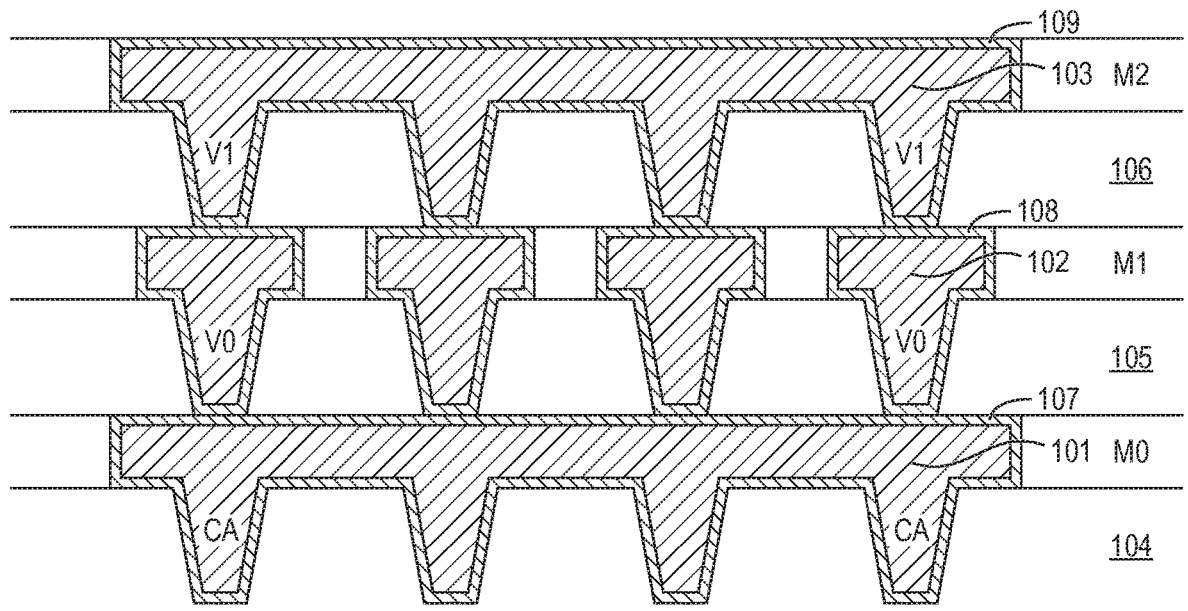

Accordingly, the continuous vertical section 209 of the embodiment of the power rail 204 illustrated in FIGS. 2A-2B replaces the lower power supply trace in the lower metal layer M0, the metal stub in metal layer M1, and the lower via V0 extending between the lower power supply trace and the metal stub in a conventional power rail structure, as shown, for instance, in FIGS. 1A-1B. Additionally, the continuous vertical section 209 of the embodiment of the power rail 204 illustrated in FIGS. 2A-2B eliminates the portion of the liner that separates the lower power supply trace from the lower via V0 in a conventional power rail structure. In this manner, the continuous vertical section 209 of conductive material of the power rail 204, which extends continuously through three vertical layers of the stack 205, reduces the utilization of liners and vias connecting discrete metal levels, as in related art integrated circuits, shown, for instance, in FIGS. 1A-1B.

Eliminating high-resistance vias and a portion of the liner reduces the total resistance of the power rail 204 of the present disclosure compared to conventional power rails. Additionally, eliminating vias increases the geometric size (e.g., volume) of the power rail 204 compared to conventional power rail structures, and the increased geometric size (e.g., volume) of the power rail structure 204 causes the continuous vertical section 209 to exhibit a resistance that is equal or substantially equal to the bulk resistance properties of the conductive material of the continuous vertical section 209. In contrast, the relatively smaller geometries of the metal stub and the lower power supply trace in the lower metal layer M0 utilized in conventional power rail structures causes the conductive material to exhibit a resistance that is greater than the bulk resistance properties of the conductive material of the metal stub and the lower power supply trace (e.g., approximately twice the bulk resistance of the conductive material). Reducing the utilization of dense vias also eases the requirement of aggressive patterning during fabrication of the integrated circuit.

Additionally, in the illustrated embodiment, the power rail 204 includes an upper power supply trace 211 in the upper metal layer M2 (e.g., an uppermost trace) and a second via V1 (e.g., an uppermost via) extending between the continuous vertical section 209 of the power rail 204 and the upper power supply trace 211. In the illustrated embodiment, the integrated circuit 200 also includes a liner 212 surrounding the dual-damascene levels of the upper power supply trace 211 and the second via V1. In one or more embodiments, such as in high-density (HD) standard cells, the second via V1 and the upper power supply trace 211 may be omitted from the power rail 204 to free up routing in the upper metal layer M2.

The conductive material of the continuous vertical section 209 of the power rail 204 may be metal. In one or more embodiments, the conductive material (i.e., a filling conductor) of the continuous vertical section 209 of the power rail 204 may be copper (Cu), cobalt (Co), ruthenium (Ru), or combinations thereof.

Figure 3:
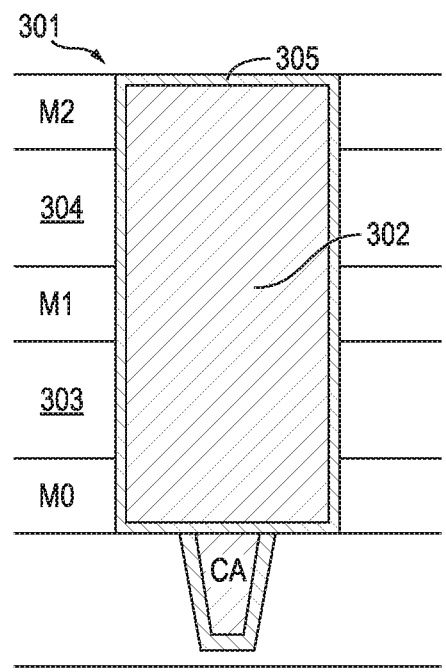
FIG. 3 is a schematic cross-sectional view of a semiconductor integrated circuit including a power rail according to another embodiment of the present disclosure.

In one or more embodiments, the continuous vertical section of the power rail may extend continuously through any other number of metal layers and insulation layers in the stack. For instance, FIG. 3 depicts an embodiment of a semiconductor integrated circuit in which a power rail 301 includes a continuous vertical section 302 of conductive material (e.g., copper (Cu), cobalt (Co), ruthenium (Ru), or combinations thereof) extending continuously through a lowermost metal layer M0, a lower insulating layer 303 on the lowermost metal layer M0, a second metal layer M1 on the lower insulating layer 303, a second insulating layer 304 on the second metal layer M1, and a third metal layer M2 on the second insulating layer 304 (i.e., the continuous vertical section 302 of the power rail 301 extends continuously through three metal layers and two insulating via layers). Additionally, in the illustrated embodiment, the power rail 301 includes a liner 305 extending around the continuous vertical section 302 of the conductive material of the power rail 301. The liner 305 does not extend through (e.g., bisect) the continuous vertical section 302 of the power rail 301.

Accordingly, the continuous vertical section 302 of the embodiment of the power rail 301 illustrated in FIG. 3 replaces the lower power supply trace in the lower metal layer M0, the metal stub in metal layer M1, the upper power supply trace in the upper metal layer M2, the lower via V0 extending between the lower power supply trace and the metal stub, and the upper via V1 extending between the metal stub and the upper power supply trace in a conventional power rail structure, as shown, for instance, in FIGS. 1A-1B. Additionally, the continuous vertical section 302 of the embodiment of the power rail 301 illustrated in FIG. 3 eliminates the portions of the liners that separate the lower power supply trace from the lower via V0 and the metal stub from the upper via V1 in a conventional power rail structure. In this manner, the continuous vertical section 302 of conductive material of the power rail 301, which extends continuously through five vertical layers of the stack, reduces the utilization of liners and vias connecting discrete metal levels, as in related art integrated circuits, shown, for instance, in FIGS. 1A-1B.

Eliminating high-resistance vias and portions of the liners reduces the total resistance of the power rail 301 of the present disclosure compared to conventional power rails. Additionally, eliminating vias increases the geometric size (e.g., volume) of the power rail 301 compared to conventional power rail structures, and the increased geometric size (e.g., volume) of the power rail structure 301 causes the continuous vertical section 302 to exhibit a resistance that is equal or substantially equal to the bulk resistance properties of the conductive material of the continuous vertical section 302. In contrast, the relatively smaller geometries of the lower power supply trace, the metal stub, and the upper power supply trace utilized in conventional power rail structures causes the conductive material to exhibit a resistance that is greater than the bulk resistance properties of the conductive material of the lower power supply trace, the metal stub, and the upper power supply trace (e.g., approximately twice the bulk resistance of the conductive material). Reducing the utilization of dense vias also eases the requirement of aggressive patterning during fabrication of the integrated circuit.

Figure 4:
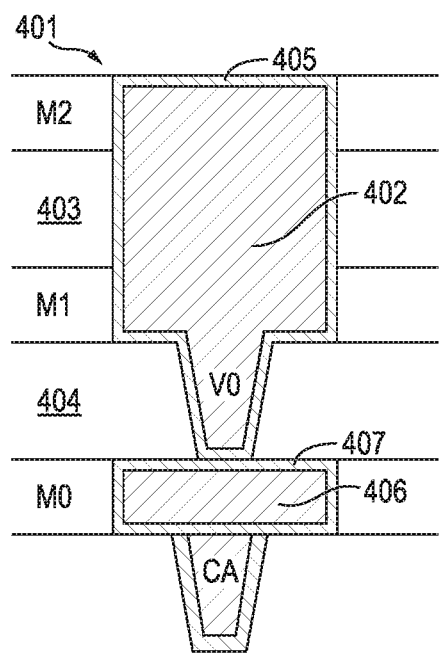
FIG. 4 is a schematic cross-sectional view of a semiconductor integrated circuit including a power rail according to a further embodiment of the present disclosure.

FIG. 4 depicts an embodiment of a semiconductor integrated circuit in which a power rail 401 includes a continuous vertical section 402 of conductive material (e.g., copper (Cu), cobalt (Co), ruthenium (Ru), or combinations thereof) extending continuously through a second metal layer M1, an upper insulating layer 403 on the second metal layer M1, and a third metal layer M2 on the upper insulating layer 403 (i.e., the continuous vertical section 402 of the power rail 401 extends continuously through two metal layers and one insulating via layer). The power rail 401 also includes a via V0 in a lower insulating layer 404 connected to the continuous vertical section 402.

In the illustrated embodiment, the semiconductor integrated circuit 400 also includes a liner 405 extending around the continuous vertical section 402 of the conductive material of the power rail 401. The liner 405 does not extend through (e.g., bisect) the continuous vertical section 402 of the power rail 401. Additionally, in the illustrated embodiment, the power rail 401 includes a lower power supply trace 406 in a lowermost metal layer M0 (e.g., a lowermost trace) and a liner 407 surrounding the damascene levels of the lower power supply trace 406 and a contact CA connected to the lower power supply trace 406.

The configuration of the power rail 401 illustrated in FIG. 4 may be utilized without a power rail on the lowermost metal layer M0. In such a case, increased M0 signal routing resources are available.

Accordingly, the continuous vertical section 402 of the embodiment of the power rail 401 illustrated in FIG. 4 replaces the metal stub in metal layer M1, the upper power supply trace in the upper metal layer M2, and the upper via V1 extending between the metal stub and the upper power supply trace in a conventional power rail structure, as shown, for instance, in FIGS. 1A-1B. Additionally, the continuous vertical section 402 of the embodiment of the power rail 401 illustrated in FIG. 4 eliminates the portion of the liner that separates the metal stub from the upper via V1 in a conventional power rail structure. In this manner, the continuous vertical section 402 of conductive material of the power rail 401, which extends continuously through three vertical layers of the stack, reduces the utilization of liners and vias connecting discrete metal levels, as in related art integrated circuits, shown, for instance, in FIGS. 1A-1B.

As described above, eliminating high-resistance vias and a portion of the liner reduces the total resistance of the power rail 401 of the present disclosure compared to conventional power rails. Additionally, eliminating vias increases the geometric size (e.g., volume) of the power rail 401 compared to conventional power rail structures, and the increased geometric size (e.g., volume) of the power rail structure 401 causes the continuous vertical section 402 to exhibit a resistance that is equal or substantially equal to the bulk resistance properties of the conductive material of the continuous vertical section 402. In contrast, the relatively smaller geometries of the metal stub and the upper power supply trace utilized in conventional power rail structures causes the conductive material to exhibit a resistance that is greater than the bulk resistance properties of the conductive material of the metal stub and the upper power supply trace (e.g., approximately twice the bulk resistance of the conductive material). Reducing the utilization of dense vias also eases the requirement of aggressive patterning during fabrication of the integrated circuit.

Figure 5:
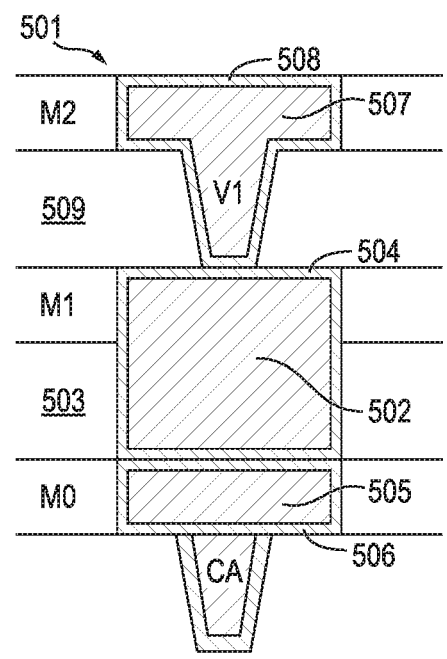
FIG. 5 is a schematic cross-sectional view of a semiconductor integrated circuit including a power rail according to a further embodiment of the present disclosure.

FIG. 5 depicts an embodiment of a semiconductor integrated circuit in which a power rail 501 includes a continuous vertical section 502 of conductive material (e.g., copper (Cu), cobalt (Co), ruthenium (Ru), or combinations thereof) extending continuously through a lower insulating layer 503 and a metal layer M1 on the lower insulating layer 503 (i.e., the continuous vertical section 502 of the power rail 501 extends continuously through one metal layer and one insulating via layer).

In the illustrated embodiment, the semiconductor integrated circuit also includes a liner 504 extending around the continuous vertical section 502 of the conductive material of the power rail 501. The liner 504 does not extend through (e.g., bisect) the continuous vertical section 502 of the power rail 501. Additionally, in the illustrated embodiment, the power rail 501 includes a lower power supply trace 505 in a lowermost metal layer M0 (e.g., a lowermost trace) and a liner 506 surrounding the damascene levels of the lower power supply trace 505 and a contact CA connected to the lower power supply trace 505. In the illustrated embodiment, the power rail 501 also includes an upper power supply trace 507 in an upper metal layer M2 (e.g., an uppermost trace) and a liner 508 surrounding the dual-damascene levels of the upper power supply trace 507 and an upper via V1 in an upper insulating layer 509 connected to the upper power supply trace 507.

Accordingly, the continuous vertical section 502 of the embodiment of the power rail 501 illustrated in FIG. 5 replaces the metal stub in metal layer M1 and the lower via V0 connected to the metal stub in a conventional power rail structure, as shown, for instance, in FIGS. 1A-1B. In this manner, the continuous vertical section 502 of conductive material of the power rail 501, which extends continuously through two vertical layers of the stack, reduces the utilization of vias connecting discrete metal levels, as in related art integrated circuits, shown, for instance, in FIGS. 1A-1B.

As described above, eliminating high-resistance vias reduces the total resistance of the power rail 501 of the present disclosure compared to conventional power rails. Additionally, eliminating vias increases the geometric size (e.g., volume) of the power rail 501 compared to conventional power rail structures, and the increased geometric size (e.g., volume) of the power rail structure 501 causes the continuous vertical section 502 to exhibit a resistance that is equal or substantially equal to the bulk resistance properties of the conductive material of the continuous vertical section 502. In contrast, the relatively smaller geometries of the metal stub utilized in conventional power rail structures causes the conductive material to exhibit a resistance that is greater than the bulk resistance properties of the conductive material of the metal stub (e.g., approximately twice the bulk resistance of the conductive material). Reducing the utilization of dense vias also eases the requirement of aggressive patterning during fabrication of the integrated circuit.

A cell architecture incorporating an embodiment of the power rail described herein (e.g., an embodiment of the power rail depicted in FIGS. 2A-2B, 3, 4, or 5) may enable a reduction in integrated circuit size compared to cells incorporating conventional power rail structures (e.g., the conventional power rail structure depicted in FIGS. 1A-1B) by enabling upper level routing tracks (e.g., the third metal layer M2) to be used only for signal routing. A cell architecture incorporating an embodiment of the power rail described herein enables improved DC FOM (e.g., higher Ieff) and/or AC FOM (e.g., higher frequency at iso power) due to lower parasitic resistance between the power rail and source/drain (S/D) regions, and/or reduced cell height, which enables a reduction in back-end-of-line (BEOL) run length and a corresponding reduction in parasitic capacitance ($C_{para}$) or parasitic resistance ($R_{para}$) associated with the BEOL run length between cells. A cell architecture incorporating an embodiment of the power rail described herein having a relatively narrow width compared to conventional power rails can have more routing tracks used only for signal routing, which enables an increase in the pitch of the routing tracks compared to conventional cell architectures while achieving the same or a reduced cell height as the conventional cell architecture. A cell architecture incorporating an embodiment of the power rail described herein may have an increased pitch of the routing tracks compared to conventional cell architecture due to increased line width and/or increased spacing of the routing tracks, which enables a reduction in $R_{para}$ or $C_{para}$ associated with the materials within or between the routing tracks. A cell architecture incorporating an embodiment of the power rail described herein enables an improved DC FOM and/or improved AC FOM due to lower $R_{para}$ than conventional cell architecture that is associated with the large-surface power rail structure connection without vias. A cell architecture incorporating an embodiment of the power rail described herein enables an improved DC FOM and/or improved AC FOM due to lower $R_{para}$ and $R_{para}$ than conventional cell architecture due to decreased congestion of signal routing. A cell architecture incorporating an embodiment of the power rail described herein enables an improved DC FOM and/or improved AC FOM due to lower $R_{para}$ and $C_{para}$ than conventional cell architecture that is associated with the routing tracks as well as lower $R_{para}$ between the power rail and source/drain regions and/or reduced cell height, thereby enabling reduced BEOL run length between the cells. A cell architecture incorporating an embodiment of the power rail described herein enables an improved DC FOM and/or improved AC FOM due to, for instance, reducing cell height, reducing the number of upper level routing tracks used for power distribution, and/or increasing the pitch of the upper level routing tracks compared to conventional cell architectures.

Figure 6A:
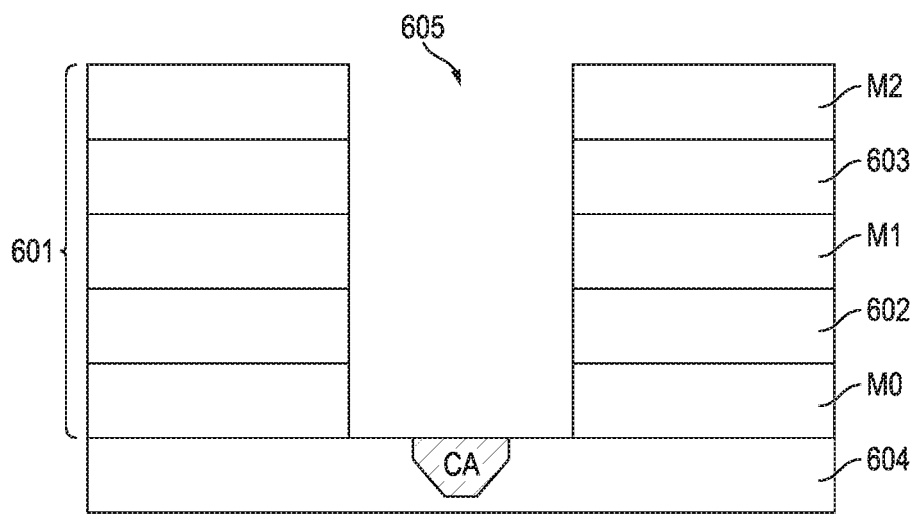
FIGS. 6A-6B depict schematic cross-sectional views of tasks of a method of forming a semiconductor integrated circuit having a power rail according to one embodiment of the present disclosure.
Figure 6B:
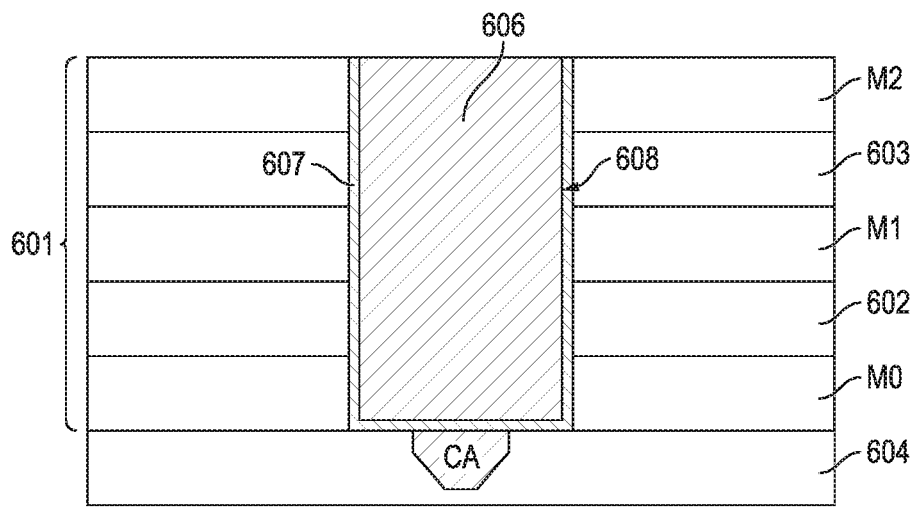

FIGS. 6A-6B illustrate a method of manufacturing the power rail 301 of FIG. 3 for a semiconductor integrated circuit according to one embodiment of the present disclosure. As illustrated in FIG. 6A, the method includes a task of etching a stack 601 of alternating metal layers M0, M1, M2 and insulating via layers 602, 603 on a substrate 604 to form a deep trench or cavity 605 in the stack 601 (e.g., performing a high aspect ratio dielectric etch). The task of etching the stack 601 may be performed by any suitable process or technique, such as, for instance, lithography, sidewall-image transfer, or dry etching. The task of etching the stack 601 to form the cavity 605 may include a single etch task or two or more etch tasks. In one or more embodiments, etching the stack 601 of alternating metal layers may refer to etching insulating material in the metal layer, so that metal may be later deposited in the etched cavity. The trench or cavity 605 extends vertically through two or more layers of the stack 601. The depth of the cavity 605 (i.e., the layers through which the cavity 605 extends) may be selected depending on the desired configured of the power rail. For instance, in the illustrated embodiment, the cavity extends through the upper metal layer M2, the upper insulating via layer 603, the intermediate metal layer M1, the lower insulating via layer 602, and the lower metal layer M0 (i.e., the cavity 605 extends all the way down to the substrate 604). In one or more embodiments, the cavity 605 may extend through only the upper metal layer M2, the upper insulating via layer 603, and the intermediate metal layer M1. In one or more embodiments, the cavity 605 may extend through only the lower metal layer M0, the first insulating via layer 602, and the second metal layer M1. In one or more embodiments, the cavity 605 may extend through only the metal layer M1 and the first insulating via layer 602.

With reference now to FIG. 6B, the method also includes a task of forming the power rail 301 of FIG. 3 by depositing a conductive material 606 in the cavity 605. The task of depositing the conductive material 606 in the cavity 605 may include a single deposition task and may be performed by any suitable technique or process now known in the art or hereinafter developed. In one or more embodiments, the task of forming the power rail 301 may include an additional masking task. In one or more embodiments, the conductive material may be a metal, such as, for instance, copper (Cu), cobalt (Co), ruthenium (Ru), or combinations thereof.

In one or more embodiments, the task of forming the power rail 301 may include a task of forming a liner 607 (e.g., depositing a liner) prior to the task of depositing the conductive material 606 in the cavity 605. Additionally, in one or more embodiments, the task of forming the power rail 301 may include a task of chemical-mechanical planarization (CMP) after the task of depositing of the conductive material 606 in the cavity 605. In the illustrated embodiment, the CMP task is configured to process the conductive material 606 deposited into the cavity 605 to have the same topology (upper surface level) as the upper metal layer M2.

In one or more embodiments, the task of forming the power rail 301 may be performed with a single patterned layer. In one or more embodiments, the task of forming the power rail 301 may be performed with any suitable patterning technique now known or hereinafter developed, such as, for instance, with a multiple patterning technique (e.g., a litho-etch, litho-etch (LELE) sequence), or a self-aligned patterning sequence such as self-aligned double-patterning (SADP) or self-aligned quad-patterning (SAQP). In one or more embodiments, the task of forming the power rail 301 may share the same deposition/fill task and/or the same CMP task as a topmost metal layer (e.g., M2) covered by the power rail 301.

As illustrated in FIG. 6B, the power rail 301 of FIG. 3 includes a continuous vertical section 608 of the deposited conductive material 606 (e.g., a metal such as Cu, Co, Ru, or combinations thereof) that extends continuously through the lower metal layer M0, the lower insulating layer 602, the intermediate metal layer M1, the upper insulating layer 603, and the upper metal layer M2 (i.e., the continuous vertical section 608 of the power rail 301 extends through three metal layers M0, M1, M2 and two insulating layers 602, 603). In one or more embodiments, the continuous vertical section 608 of the power rail 600 may extend continuously through any other number of metal and insulating layers depending on the configuration (e.g., depth) of the cavity 605 formed during the task of etching of the stack 601. For instance, in one or more embodiments, the continuous vertical section 608 of the deposited material 606 may extend continuously through the lowermost metal layer M0, the lower insulating via layer 602, and the intermediate metal layer M1 (i.e., the continuous vertical section 608 of the power rail extends through two metal layers M0, M1 and one insulating layer 602). In one or more embodiments, the continuous vertical section 608 of the deposited material 606 may extend continuously through the intermediate metal layer M1, the upper insulating via layer 603, and the upper metal layer M2 (i.e., the continuous vertical section 608 of the power rail extends through two metal layers M1, M2 and one insulating layer 603). Additionally, in one or more embodiments, the continuous vertical section 608 of the deposited material 606 may extend continuously through only the metal layer M1 and the lower insulating layer 602 (i.e., the continuous vertical section 608 of the power rail extends through one metal layer M1 and one insulating layer 602). The power rail formed according to the method of the present disclosure may have any suitable configuration, such as, for instance, any configuration of the power rail described above with reference to the embodiments illustrated in FIGS. 2A-5. In one or more embodiments, two or more power rails may be formed and different power rail structures may be formed with different depths, for instance, to satisfy voltage (IR) drop and electromigration (EM) requirements.

Although the present invention has been described with reference to the example embodiments, those skilled in the art will recognize that various changes and modifications to the described embodiments may be performed, all without departing from the spirit and scope of the present invention. Furthermore, those skilled in the various arts will recognize that the present invention described herein will suggest solutions to other tasks and adaptations for other applications. It is the applicant's intention to cover by the claims herein, all such uses of the present invention, and those changes and modifications which could be made to the example embodiments of the present invention herein chosen for the purpose of disclosure, all without departing from the spirit and scope of the present invention. Thus, the example embodiments of the present invention should be considered in all respects as illustrative and not restrictive, with the spirit and scope of the present invention being indicated by the appended claims, and their equivalents.

What is claimed is:
1. A semiconductor integrated circuit, comprising:
a substrate;
a plurality of metal layers including metal layer M0, metal layer M1, and metal layer M2;
a plurality of insulating layers, wherein the plurality of metal layers and the plurality of insulating layers are alternately arranged in a stack on the substrate;
at least two standard cell-based logic blocks in the substrate; and at least one power rail crossing over a boundary of each of the at least two standard cell-based logic blocks, the at least one power rail comprising a vertical section of conductive material extending continuously through at least two vertical levels of the stack, the at least two vertical levels comprising one metal layer of the metal layers M0, M1, and M2 and one insulating layer of the plurality of insulating layers, wherein the one insulating layer is above the one metal layer.

2. The semiconductor integrated circuit of claim 1, wherein the at least two vertical levels comprises at least three vertical levels of the stack, the at least three vertical levels comprising two metal layers of the plurality of metal layers and one insulating layer of the plurality of insulating layers between the two metal layers.

3. The integrated circuit of claim 2, wherein the two metal layers comprise the metal layer M0 and the metal layer M1.

4. The integrated circuit of claim 3, further comprising an upper power supply trace in the metal layer M2 and a via extending between the upper power supply trace and the vertical section of the power rail.

5. The integrated circuit of claim 2, wherein the two metal layers comprise the metal layer M1 and the metal layer M2.

6. The integrated circuit of claim 5, further comprising a lower power supply trace in the metal layer M0 and a via extending between the vertical section of the power rail and the lower power supply trace.

7. The integrated circuit of claim 2, wherein the at least three vertical levels of the stack comprise three metal layers and two insulating layers, the three metal layers comprising the metal layer M0, the metal layer M1, and the metal layer M2.

8. The semiconductor integrated circuit of claim 1, wherein the vertical section of the conductive material of the at least one power rail does not include a via.

9. The semiconductor integrated circuit of claim 1, further comprising a liner extending around the vertical section of the conductive material, and wherein the liner does not extend through the vertical section of the conductive material.

10. The semiconductor integrated circuit of claim 1, wherein the vertical section of the power rail exhibits a resistance substantially equal to a bulk resistance of the conductive material.

11. The integrated circuit of claim 10, wherein a filling conductor of the at least one power rail is a metal comprising Cu, Co, Ru, or combinations thereof.

12. The semiconductor integrated circuit of claim 1, wherein the conductive material of the at least one power rail comprises a metal.

13. A method of forming at least one power rail for a semiconductor integrated circuit, the method comprising:
  etching a stack of alternating metal layers and insulating layers on a substrate to form a cavity in the stack, the metal layers including metal layer M0, metal layer M1, and metal layer M2; and
  forming the at least one power rail comprising depositing a conductive material in the cavity, the at least one power rail comprising a vertical section of conductive material extending continuously through at least two vertical levels of the stack, the at least two vertical levels comprising one metal layer of the metal layers M0, M1, and M2 and one insulating layer of the insulating layers,
  wherein the one insulating layer is above the one metal layer,
  wherein at least two standard cell-based logic blocks are in the substrate, and
  wherein the at least one power rail crosses over a boundary of each of the at least two standard cell-based logic blocks.

14. The method of claim 13, wherein the etching comprises a single etch task.

15. The method of claim 13, further comprising forming a liner prior to the depositing of the conductive material.

16. The method of claim 13, wherein the forming power rail further comprises chemical-mechanical planarization after the depositing of the conductive material.

17. The method of claim 13, wherein the forming power rail further comprises a masking task.

18. The method of claim 13, wherein the forming the power rail comprises a single patterning task or a LELE, SADP, or SAQP-patterning sequence.

19. The method of claim 13, wherein the conductive material comprises a metal selected from the group of metals consisting of Cu, Co, Ru, and combinations thereof.

20. A method of forming at least one power rail for a semiconductor integrated circuit, the method comprising:
  etching a stack of alternating metal layers and insulating layers on a substrate to form a cavity in the stack, the metal layers including metal layer M0, metal layer M1, and metal layer M2; and
  forming the at least one power rail comprising depositing a conductive material in the cavity, the at least one power rail comprising a vertical section of conductive material extending continuously through at least two vertical levels of the stack, the at least two vertical levels comprising one metal layer of the metal layers M0, M1, and M2 and one insulating layer of the insulating layers,
  wherein the etching of the stack comprises a single lithography task,
  wherein the one insulating layer is above the one metal layer,
  wherein at least two standard cell-based logic blocks are in the substrate, and
  wherein the at least one power rail crosses over a boundary of each of the at least two standard cell-based logic blocks.

* * * * *